United States Patent [19]

Horn, III et al.

[11] Patent Number: 5,552,210
[45] Date of Patent: *Sep. 3, 1996

[54] CERAMIC FILLED COMPOSITE POLYMERIC ELECTRICAL SUBSTRATE MATERIAL EXHIBITING HIGH DIELECTRIC CONSTANT AND LOW THERMAL COEFFICIENT OF DIELECTRIC CONSTANT

[75] Inventors: Allen F. Horn, III, Danielson, Conn.; Robert L. Bush, Phoenix, Ariz.; Michael E. St. Lawrence, Thompson, Conn.

[73] Assignee: Rogers Corporation, Rogers, Conn.

[*] Notice: The term of this patent shall not extend beyond the expiration date of Pat. No. 5,358,775.

[21] Appl. No.: 335,510

[22] Filed: Nov. 7, 1994

[51] Int. Cl.⁶ .................................................. B32B 3/00
[52] U.S. Cl. ...................... 428/209; 428/901; 428/405; 428/327; 428/325; 428/331; 428/421; 428/320.2; 361/750
[58] Field of Search .................................. 428/209, 405, 428/327, 325, 331, 421, 320.2, 901; 361/750

[56] References Cited

U.S. PATENT DOCUMENTS

| | | | |
|---|---|---|---|
| 3,258,387 | 6/1966 | Brown et al. | 428/324 |
| 4,194,040 | 3/1980 | Breton et al. | 428/325 |
| 4,335,180 | 6/1982 | Traut | 428/303 |
| 4,849,284 | 7/1989 | Arthur et al. | 428/325 |
| 4,886,699 | 12/1989 | Carroll et al. | 428/228 |
| 4,985,296 | 1/1991 | Mortimer, Jr. | 428/220 |
| 4,990,544 | 2/1991 | Asaumi et al. | 428/325 |
| 4,996,097 | 2/1991 | Fischer | 428/901 |
| 5,024,871 | 6/1991 | Arthur et al. | 428/209 |
| 5,055,342 | 10/1991 | Markovich et al. | 428/323 |
| 5,061,548 | 10/1991 | Arthur et al. | 428/209 |
| 5,077,115 | 12/1991 | Arthur et al. | 428/137 |
| 5,149,590 | 9/1992 | Arthur et al. | 428/421 |
| 5,194,326 | 3/1993 | Arthur et al. | 428/325 |
| 5,198,295 | 3/1993 | Arthur et al. | 428/323 |
| 5,223,568 | 6/1993 | Landi et al. | 524/571 |
| 5,281,466 | 1/1994 | Arthur et al. | 428/195 |
| 5,312,576 | 5/1994 | Swei et al. | 264/112 |
| 5,358,775 | 10/1994 | Horn, III | 428/325 |
| 5,384,181 | 1/1995 | Arthur et al. | 428/195 |

*Primary Examiner*—Patrick J. Ryan
*Assistant Examiner*—Cathy K. Lee
*Attorney, Agent, or Firm*—Fishman, Dionne & Cantor

[57] ABSTRACT

A high dielectric (K'≧5), comparatively low thermal coefficient (absolute value of TCK'≦200 ppm/°C.) polymeric composite matrix is presented comprising commonly available and low cost fillers such as titania, alumina and magnesium oxide.

28 Claims, 1 Drawing Sheet

CERAMIC FILLED COMPOSITE POLYMERIC ELECTRICAL SUBSTRATE MATERIAL EXHIBITING HIGH DIELECTRIC CONSTANT AND LOW THERMAL COEFFICIENT OF DIELECTRIC CONSTANT

BACKGROUND OF THE INVENTION

This invention relates generally to filled polymeric composites. More particularly, this invention relates to a polymeric composite for use as an electrical substrate material which exhibits both a high dielectric constant (K') and a low thermal coefficient of dielectric constant (TCK'). This electrical substrate material is particularly useful as a laminate for manufacturing microwave circuits.

The electrical performance of electrical circuits and devices is highly dependant on the dielectric constant, K', of the dielectric medium. Thus, when the dielectric constant of a material changes with temperature, the electrical performance of the device will change as well.

A basic treatment of the factors affecting the temperature coefficient of dielectric constant (TCK') of homogeneous compounds is discussed in detail in U.S. patent application Ser. No. 08/099,245 now U.S. Pat. No. 5,358,775, which is assigned to the assignee hereof, all of the contents of which are incorporated herein by reference.

Many polymeric composite materials are presently available for use as a laminate for microwave frequency electronic applications. Prevalent amongst these materials are composite systems based on PTFE (poly(tetrafluoroethylene)) and other fluoropolymers (such as FEP (poly(tetrafluoroethylene-co-hexafluoropropylene) and DuPont's PFA). Fluoropolymeric composites are desirable due to their excellent high-frequency electrical properties and excellent high temperature and solvent resistance. When referring to organic polymer based composite circuit substrate, low K' generally denotes a K' value of less than 3.0, while high K' implies a value of greater than about 4.0.

A common class of fluoropolymeric composite microwave laminates are those that are reinforced in the XY plane with either woven glass cloth or random glass microfiber. Examples of such materials are Rogers Corporation's RT/duroid® 5880 (e.g., random glass), and Ultralam® 2000 (woven glass) and the material described in U.S. Pat. No. 4,886,699, assigned to the assignee hereof and incorporated herein by reference. The dielectric constant values of these types of materials commonly ranges from 2.17 to about 2.65. This class of materials exhibits comparatively high Z-axis coefficients of thermal expansion (CTE), ranging from +125 to +250 ppm/°C. In spite of the high Z-axis CTE of these materials, the thermal coefficient of K' is relatively low. The TCK' of RT/duroid 5880 has been measured to be approximately −75 ppm/°C. at a frequency of 10 GHz over the temperature range of 20° C. to 250° C. This comparatively good TCK' is due in part to the relatively low K° of this class of materials.

Another type of fluoropolymer composite useful in microwave laminates is described in U.S. Pat. No. 4,849,284, assigned to the assignee hereof and incorporated herein by reference. A preferred embodiment of this invention is sold by Rogers Corporation to the microwave circuit board industry under the trademark RT/duroid® 6002. This composite material consists of fused amorphous silica, PTFE and E-glass microfibers. It exhibits a K' of 2.94, a Z-axis CTE of about 24 ppm/°C. and a TCK' of about +20 ppm/°C. The small value for the TCK' allows for stable electrical performance of circuits made on RT/duroid 6002 over a wide range of temperature. This feature is highly valued by designers of microwave circuits.

This and other materials made with a similar formulation, however, are not available with a K' of greater than about 3.0, due to the comparatively low K' (3.78) of the silica filler.

It is known that there is also a need for comparatively high K' (K'≧5) fluoropolymeric composite materials such as those described in U.S. Pat. No. 4,335,180, (which is assigned to the assignee hereof and incorporated herein by reference). Such high K' materials are sold by Rogers Corporation under the trademark RT/duroid 6006 (K'=6.15) and RT/duroid 6010 (K' of 10.2 to 10.8). This class of materials is generally made by adding titania ceramic filler to increase the K' of the material. These high K' materials exhibit z-axis CTE's of about +45 ppm/°C. to +80 ppm/°C. and TCK' values of about −500 ppm/°C. to −600 ppm/°C. The major factor in causing the high TCK' of this class of materials is the high TCK' of the ceramic filler that is added to modify the K' (although as is demonstrated in the examples below, it has been discovered by the inventor herein that the CTE also plays a major role). Titania ($TiO_2$) itself exhibits a TCK' of approximately −750 ppm/°C.

It is clear from the discussion above that the prior art high-K' composite laminate materials do not exhibit a low TCK'. Some recently developed materials, however, simultaneously achieve these two properties.

One such material is TMM® temperature stable microwave laminate sold by Rogers Corporation and described in detail in U.S. Pat. No. 5,223,568, which is assigned to the assignee hereof and incorporated herein by reference. TMM is a ceramic powder filler composite made with a thermoset (e.g., polybutadiene) matrix. TMM exhibits a low TCK' and dielectric constants of 3 to 13 depending on the type of ceramic filler used. The high-K' formulations for the TMM material requires the use of fillers that exhibit both a high K' (greater than about 30) and a low TCK'.

Ceramic materials that exhibit high-K' and low TCK' (known as NPO ceramics) are generally proprietary formulations that are made for the capacitor industry. As such, these materials are usually comparatively expensive, with prices of greater than $35/kg. Since these materials are also usually very dense (Sp.G. >5.0), the relative price on a volumetric basis can be even higher when compared to other ceramic fillers. A further drawback of some high-K'/low-TCK' ceramic fillers is that they contain the element lead. Though the lead is expected to be in an insoluble and harmless form, there are uncertainties and legal concerns associated with the lead content. Some of these NPO ceramic materials also exhibit unacceptably high dielectric loss when tested at frequencies of greater than 500 MHz.

The ceramic filled PTFE composite microwave circuit substrates described in aforementioned U.S. Pat. No. 5,358,775 are also formulated to exhibit both a high-K' and comparatively low TCK'. The formulations require a low TCK' (absolute value of less than 150 ppm/°C.) ceramic filler of the type described above (e.g., NPO ceramic) that exhibits a K' of greater than about 30 and a second filler that exhibits a low coefficient of thermal expansion. The drawbacks inherent in using high-K'/low-TCK' ceramic materials of this type, particularly the associated high cost, are discussed above.

SUMMARY OF THE INVENTION

The above-discussed and other problems and deficiencies of the prior art are overcome or alleviated by the polymeric electrical substrate material exhibiting high dielectric constant and low thermal coefficient of dielectric constant of the present invention. In accordance with the present invention, a high dielectric constant (K'≧5) microwave-frequency laminate with a comparatively low thermal coefficient of K' (absolute value of TCK'≦200 ppm/°C.) comprises a filled polymeric composite containing at least two chemically different ceramic fillers. An important feature of the present invention is to provide high-K' microwave laminates with a low TCK' (target absolute value of less than 200 ppm/°C.) using inexpensive and widely available fillers.

The polymeric matrix may be either thermoplastic or thermoset. At least one of the two ceramic fillers exhibits a K'<30 and a TCK'>0 ppm/°C. while one or more of the other fillers exhibits a K'>30 and a TCK'<-300 ppm/°C. These properties describe inexpensive and commonly available fillers such as titania, alumina and magnesium oxide. By judiciously blending these fillers, it has been determined that a low TCK'/high-K' laminate suitable for microwave frequency circuits can be made.

The above-discussed and other features and advantages of the present invention will be appreciated and understood by those of ordinary skill in the art from the following detailed description and drawings.

BRIEF DESCRIPTION OF THE DRAWINGS

Referring now to the drawings, wherein like elements are numbered alike in the FIGS.

DESCRIPTION OF THE PREFERRED EMBODIMENTS

Figure 1:
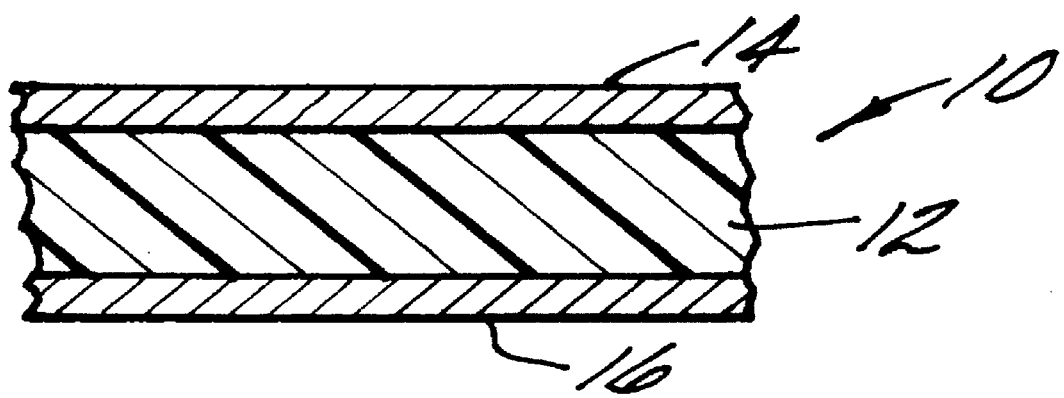
FIG. 1 is a cross-sectional elevation view of the electrical substrate material of this invention formed into a diclad laminate.

The present invention is a ceramic powder filled polymeric composite printed circuit board substrate, suitable for high frequency (microwave) applications that exhibits both a high K' (K'>4) and a low TCK'. Unlike the above-discussed prior art materials that exhibit these properties, the present invention does not require the use of a high-K'/low TCK' ceramic filler (e.g., expensive NPO ceramic) with its associated drawbacks.

In the preferred embodiment, the invention consists of a composite polymeric material containing at least two chemically different ceramic fillers. The total volume fraction of the two fillers may cover the range of about 0.50 to 0.70 on a void-free basis, while the volume fraction of the polymer may range from about 0.30 to 0.50.

The present invention achieves the combination of high-K'/low TCK' in the polymeric composite by using a commonly available high-K'/high-negative TCK' filler (TCK'<-300 ppm/°C.) such as titania, SrTiO$_3$ or CaTiO$_3$ and a comparatively low-K' filler that exhibits a positive TCK' such as alumina, silica, magnesium oxide or MgTiO$_3$. The polymeric matrix system may be either a thermoset or a thermoplastic.

The low-K' filler exhibits a K' of less than about 30 and a positive TCK' (e.g., TCK' of >0). Alumina, for example, exhibits a K' of about 10 and a TCK' of about +120 ppm/°C., magnesium oxide exhibits a K' of about 8 and a TCK' of +190 ppm/°C. and silica exhibits a K' of 3.78 and a TCK' of +90 ppm/°C. Certain magnesium titanates also exhibit a TCK'>0. Other low K' fillers with a positive TCK' may be proprietary materials such as the "SMAT" series of dielectric ceramics manufactured by Trans-Tech, Inc. of Adamstown, Md. It is a surprising and unexpected result that blending these materials with a high K'/high negative TCK' material such as titania can result in composites with a low TCK', in light of their relatively low K' and TCK' values.

In order to meet the desirable TCK' target of an absolute value less than about 200 ppm/°C. and preferably less than about 75 ppm/°C., the z-axis CTE of the composite material must be less than about 30–40 ppm/°C. In fluoropolymeric composites, the total filler content must be greater than about 50 volume % to achieve this z-axis CTE. With a highly crosslinked thermoset such as the polybutadiene matrix described in U.S. Pat. No. 5,223,568, the total filler content may be lower.

As discussed, the polymeric matrix may be a thermoplastic or thermoset resin. Examples of a suitable thermoplastic matrix include fluoropolymers, olefin polymers such as polyethylene, polypropylene, poly(4-methylpentene), poly(phenyleneoxide) (also known as PPO) or any material exhibiting a low dielectric loss at high frequencies. Examples of a suitable thermoset matrix include the polybutadiene composition disclosed in aforementioned U.S. Pat. No. 5,223,568.

The fluoropolymeric matrix is most preferably polytetrafluoroethylene (PTFE), but may also comprise one or a combination of the following fluoropolymers: a copolymer of tetrafluoroethylene and perfluoroalkyl vinyl ether (PFA), a copolymer of hexafluoropropylene and tetrafluoroethylene (FEP), poly (ethylene-co-tetra fluoroethylene) and poly (vinylidene fluoride).

In the preferred embodiment of the invention, the two or more ceramic fillers are treated with a hydrophobic coating to improve the water absorption, ductility and copper bond strength of the fluoropolymeric composite material. Examples of efficacious and known hydrophobic coatings are silane coupling agents, titanates and zirconates.

The polymeric composite material may be fabricated by any of a number of methods previously described in both the patent and open literature. One fabrication process is essentially the same as the manufacturing process taught by Traut in U.S. U.S. Pat. No. 4,335,180, which is assigned to the assignee hereof and incorporated herein by reference. The process taught by Traut involves the dispersion of the ceramic filler and glass microfiber in water, the addition of fluoropolymer resin in dispersion form and the co-flocculation of the resin, filler and fiber. The present invention, however, does not require the incorporation of glass microfiber. The co-flocculated material is then lubricated with a hydrocarbon lubricant and formed into a sheet by paste extrusion and calendering. The content of hydrocarbon lubricant may vary form about 14% to 25% by weight, depending on the specific gravity, PSD, and morphology of the ceramic fillers.

A second fabrication process eliminates the use of water as a dispersant. In this "dry-blending" process, taught by Horn in U.S. Pat. No. 5,358,775, PTFE "fine powder" resin is blended with the ceramic fillers in a mixing device such as a Patterson Kelly Vee Blender along with the hydrocarbon lubricant and then formed into a sheet by paste extrusion and calendering.

A third fabrication process, taught by Swei et al in U.S. Pat. No. 5,312,576, assigned to the assignee hereof and incorporated herein by reference, causes the fillers and PTFE dispersion to be mixed and the viscosity increased with a viscosifying agent. The thickened mixture is then cast upon a carrier sheet and dried in an oven. The viscosifying agent is removed thermally and the composite material is sintered in a high temperature oven and released from the carrier sheet. This process is particularly well suited for the production of thin (less than 0.005") sheets.

A number of methods may be used to apply the hydrophobic coating to the ceramic fillers. The fillers may be "pre-treated" as described by Arthur et al. in U.S. Pat. No. 4,849,284. The hydrophobic coating may also be introduced to the filler-PTFE mixture with the hydrocarbon lubricant as described in U.S. Pat. No. 5,358,775. The hydrophobic coating may also be introduced in the aqueous mixture of fillers and PTFE dispersion in the casting process. All of these processes have been practically demonstrated to improve the water absorption, ductility and copper peel strength over that of composites made with untreated filler.

The following non-limiting examples demonstrate the surprising result that high-K'/low TCK' composite circuit substrates that can be made using a commonly available high-K' filler which itself exhibits a poor TCK' of $-750$ ppm/°C.

Referring to FIG. 1, the filled fluoropolymeric composite is depicted in the form of a circuit laminate 10 where the composite 12 comprises a dielectric sheet laminated between conductive sheets 14, 16 (preferably metal sheets such as copper or aluminum).

EXAMPLE 1

This example demonstrates the unexpectedly low TCK' of a thermoset composite material with a K' of about 10 using a high-K' filler with a TCK' of about $-750$ ppm/°C. and a low K' filler with a positive TCK'. It further shows the importance of controlling the composite's z-axis CTE in yielding an improved TCK'.

The TCK' values reported in this example were measured with a "microstrip" resonator. The change in dielectric constant was deduced from the change in resonant frequency with temperature. Over the temperature range of 20° C. to +100° C. when tested by this method, Rogers RT/duroid 6010 (PTFE matrix and titania filler) exhibited a TCK' of $-388$ ppm/°C.

Sample 1 was formulated to contain 25 volume % titania, 35 volume % silica and 40 volume % "polybutadiene" resin system as described in U.S. Pat. No. 5,223,568. The K' of this material was 10. As shown in table 1, this sample exhibited a TCK' of $-187$ ppm/°C. As discussed in greater detail in aforementioned U.S. Pat. No. 5,358,775 the improvement in TCK' of sample 1 over that RT/d 6010 is predominantly due to its lower z-axis CTE.

Samples 2, and 3 were formulated with 25 volume % titania, 35 volume % alumina and 40 volume % polybutadiene resin system. Sample 2 used "A-10" alumina powder which exhibits a mean particle size of about 8 microns while sample 3 used a much finer PSD alumina with a mean particle size of about 1 micron. The K' of both of these samples was 10. As shown in table 1, the substitution of alumina for silica significantly decreased the absolute value of TCK' over sample 1. The TCK' value for sample 2 was $-92$ ppm/°C. while that of sample 3 was $-10$ ppm/°C. It was unexpected that such a large improvement in TCK' could be achieved, even though the TCK' of alumina is positive based on the comparatively low K' of the alumina filler.

The low TCK' value exhibited by sample 3 relative to sample 2 is due to its lower z-axis CTE. The lower CTE value is due to the smaller mean particle size alumina filler. It is well-known that smaller particle size fillers are more efficient at reducing coefficient of thermal expansion in polymeric composites.

TABLE 1

| Sample | K' | CTE | TCK' |
| --- | --- | --- | --- |
| RT/d 6010 | 10.2 | 40 ppm/° C. | −388 ppm/° C. |
| Sample 1 | 10 | 28 ppm/° C. | −187 ppm/° C. |
| Sample 2 | 10 | 25 ppm/° C. | −92 ppm/° C. |
| Sample 3 | 10 | 12 ppm/° C. | −10 ppm/° C. |

EXAMPLE 2

This example demonstrates the unexpectedly low TCK' of a fluoropolymer composite material with a K' of about 10 using a high-K' filler with a TCK' of about $-750$ ppm/°C. and a low K' filler with a positive TCK'.

The TCK' values reported herein were measured by stripline resonance at a resonant frequency of approximately 10 GHz over the temperature range of 20° C. to 250° C. The specific method used is similar to that described in IPC-TM-650 2.5.5.5, but modified to allow heating and cooling of the test fixture.

Table 2 shows the large negative TCK' of Rogers RT/duroid 6006 fluoropolymer titania composite circuit board substrate. Sample 2039-44-13 was formulated to contain volume % titania, 34 volume % fused amorphous silica and 40 volume % PTFE. This composition was formed into a 0.060" thick laminate and exhibited a TCK' of $-243$ ppm/°C. This significant reduction in TCK' relative to RT/d 6006 is due to the reduced z-axis CTE of the composition.

Sample 2057-7-3 was formulated with 16 volume % titania, 44 volume % alumina, and 40 volume % PTFE. This material exhibited a K' of 6.5 and a TCK' of essentially zero.

Again, these data show that polymeric composite materials can be made that exhibit very low temperature coefficients of dielectric constant when properly formulated with commonly available mineral fillers.

TABLE 2

| Sample | K' | CTE | TCK' |
| --- | --- | --- | --- |
| RT/d 6006 | 6.15 | 74 ppm/° C. | −463 ppm/° C. |
| 2039-44-13 | ≈6.5 | 16 ppm/° C. | −243 ppm/° C. |
| 2057-7-3 | 6.5 | ≈16 ppm/° C. | 0 ppm/° C. |

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical substrate composite material comprising:
   (1) a polymeric matrix;
   (2) particulate ceramic filler material, said filler material comprising a mixture of;
      (a) at least one first ceramic material having a a K'>30 and a TCK'<−300 ppm/°C., said mixture of ceramic fillers being proportioned in a ratio effective to provide the composite material with a K' of ≧5 and an absolute value TCK' of ≦200 ppm/°C.; and
      (b) at least one second ceramic material having K'<30 and a TCK'>0 ppm/°C.

2. The material of claim 1 wherein:

said first ceramic material is selected from the group consisting of titania, $CaTiO_3$ and $SrTiO_3$.

3. The material of claim 1 wherein:
said second ceramic material is selected from the group consisting of alumina, silica, magnesium oxide, $MgTiO_3$.

4. The material of claim 2 wherein:
said second ceramic material is selected from the group consisting of alumina, silica, magnesium oxide, $MgTiO_3$.

5. The material of claim 1 wherein:
the composite has a Z-axis coefficient of thermal expansion of <40 ppm/°C.

6. The material of claim 1 wherein:
said polymeric matrix is present in an amount of between about 30 to 50 volume percent of the total substrate material.

7. The material of claim 1 wherein:
said filler material is present in an amount of between about 50 to 70 volume percent of the total substrate material.

8. The material of claim 7 wherein:
said filler material is present in an amount of between about 50 to 70 volume percent of the total substrate material.

9. The material of claim 1 including:
a hydrophobic coating on said ceramic materials.

10. The material of claim 9 wherein:
said coating on said ceramic materials is selected from the group consisting of silanes, titanates and zirconates.

11. The material of claim 1 wherein said composite material comprises a sheet having opposed surfaces and including:
at least one metal layer on at least a portion of a surface of the composite material.

12. The material of claim 11 wherein:
the metal layer comprises copper.

13. The material of claim 12 wherein said composite material has a planar shape and includes an X–Y plane and wherein:
the CTE of the composite material is substantially equal to the CTE of the copper.

14. The material of claim 1 wherein:
said polymeric matrix comprises fluoropolymeric material.

15. The material of claim 14 wherein:
said fluoropolymeric matrix is selected from the group consisting of polytetrafluoroethylene, a copolymer of tetrafluoroethylene and perfluoroalkyl vinyl ether, poly(ethylene-co-chlorotrifluoroethylene), poly(chlorotrifluoroethylene), poly(ethylene-co-tetrafluoroethylene) and poly(vinylidene fluoride).

16. The material of claim 1 wherein:
said composite material has an absolute value of TCK' of ≦75 ppm/°C.

17. The material of claim 1 wherein:
said polymeric matrix comprises a thermoset material.

18. The material of claim 17 wherein:
said thermoset material comprises polybutadiene material.

19. The material of claim 1 wherein:
said polymeric matrix comprises thermoplastic material.

20. The material of claim 19 wherein said thermoplastic material comprises polyolefins.

21. The material of claim 20 wherein said polyolefins are selected from the group consisting of:
polyethylene, polypropylene and poly(4-methylpentene).

22. The material of claim 19 wherein said thermoplastic material comprises poly(phenyleneoxide).

23. An electrical substrate composite material comprising:
(1) a fluoropolymeric matrix;
(2) particulate ceramic filler material, said filler material comprising a mixture of;
  (a) at least one first ceramic material selected from the group consisting of titania, $CaTiO_3$, $SrTiO_3$ having a K'>30 and a TCK'<–300 ppm/°C., said mixture of ceramic fillers being proportioned in a ratio effective to provide the composite material with a K' of ≧5 and an absolute value TCK' of ≦200 ppm/°C.; and
  (b) at least one second ceramic material selected from the group consisting of alumina, silica, magnesium oxide, and $MgTiO_3$ having K'<30 and a TCK' >0 ppm/°C.

24. An electrical substrate as claimed in claim 23 wherein said fluoropolymeric matrix comprises polytetrafluoroethylene.

25. An electrical substrate composite material comprising:
(1) a polybutadiene matrix;
(2) particulate ceramic filler material, said filler material comprising a mixture of;
  (a) at least one first ceramic material selected from the group consisting of titania, $CaTiO_3$, $SrTiO_3$ having a K'>30 and a TCK'<–300 ppm/°C., said mixture of ceramic fillers being proportioned in a ratio effective to provide the composite material with a K' of ≧5 and an absolute value TCK' of ≦200 ppm/°C.; and
  (b) at least one second ceramic material selected from the group consisting of alumina, silica, magnesium oxide, and $MgTiO_3$ having K'<30 and a TCK' >0 ppm/°C.

26. a circuit laminate comprising:
(1) an electrical substrate composite material including;
a polymeric matrix;
particulate ceramic filler material, said filler material comprising a mixture of;
  (a) at least one first ceramic material having a K'>30 and a TCK'<–300 ppm/°C. said mixture of ceramic fillers being proportioned in a ratio effective to provide the composite material with a K' of ≧5 and an absolute value TCK' of ≦200 ppm/°C.; and
  (b) at least one second ceramic material having K'<30 and a TCK'>0 ppm/°C.; and
(2) an electrically conductive layer laminated to at least a portion of a surface of said substrate.

27. A circuit as claimed in claim 26 wherein said polymeric matrix is a fluoropolymeric matrix.

28. A circuit as claimed in claim 27 wherein said fluoropolymeric matrix is polytetrafluoroethylene.

* * * * *